United States Patent
Lee et al.

(10) Patent No.: US 6,753,572 B2
(45) Date of Patent: Jun. 22, 2004

(54) FLOATING TRAP-TYPE NON-VOLATILE MEMORY DEVICE

(75) Inventors: Chang-Hyun Lee, Kyunggi-do (KR); Jung-Dal Choi, Kyunggi-do (KR); Yong-Sik Yim, Kyunggi-do (KR)

(73) Assignee: Samsung Electronics Co., Ltd., Kyungki (KR)

( * ) Notice: Subject to any disclaimer, the term of this patent is extended or adjusted under 35 U.S.C. 154(b) by 0 days.

(21) Appl. No.: 10/189,075

(22) Filed: Jul. 2, 2002

(65) Prior Publication Data

US 2003/0030100 A1 Feb. 13, 2003

(30) Foreign Application Priority Data

Jul. 31, 2001 (KR) .......................................... 2001-46234

(51) Int. Cl.⁷ ............................................ H01L 29/792
(52) U.S. Cl. ........................................................ 257/324
(58) Field of Search ................................ 257/314, 324, 257/325, 295; 438/216, 261, 591, 593

(56) References Cited

U.S. PATENT DOCUMENTS

| | | | | |
|---|---|---|---|---|
| 5,319,229 A | * | 6/1994 | Shimoji et al. | ............. 257/324 |
| 5,596,214 A | * | 1/1997 | Endo | .......................... 257/324 |
| 6,596,590 B1 | * | 7/2003 | Miura et al. | ................. 438/261 |

OTHER PUBLICATIONS

IEEE Tansaction on Composnents, Packaging, and Manufacturing Technology Part A, vol. 20 Marvin H. White, et al. "A Low Voltage SONOS Nonvolatile Semiconductor Memory Tchnology" Jun. 1997.
Chang–Hyun Lee, et al. Carrier Transport Through Boron–Doped Amorphous Diamond–Like Carbon P Layer of Amorphous Silicon Based P–I–N Solar Cells Jul. 26, 1999.
Jian–Kang Bu, et al "Design Considerations In Scaled SONOS Nonvolatile Memory Devices" Solid–State Electronics 45, 2001.
Yang, et al. "Charge Retention of Scaled SONOS Nonvolatile Memory Devices at Elevated Temperatures" Solid–Sate Electronics 44, 2000.

* cited by examiner

*Primary Examiner*—Hung Vu
(74) *Attorney, Agent, or Firm*—Marger Johnson & McCollom, P.C.

(57) ABSTRACT

A floating trap type non-volatile memory device and fabrication method thereof are provided. The floating trap type device comprises a substrate, a gate electrode formed on the substrate. A charge storage layer is interposed between the substrate and the gate electrode. A tunneling layer is interposed between the substrate and charge storage layer. The charge storage layer comprises a material having a narrower band gap than silicon nitride. The charge storage layer preferably formed of tetrahedral amorphous carbon. The potential barrier between the charge storage layer and the tunneling layer is increased by using the tetrahedral amorphous carbon as the charge storage layer. Therefore, the charge retention characteristic of the floating trap type device is improved.

28 Claims, 8 Drawing Sheets

FLOATING TRAP-TYPE NON-VOLATILE MEMORY DEVICE

This application relies for priority upon Korean Patent Application No. 2001-46234, filed on Jul. 31, 2001, the contents of which are herein incorporated by reference in their entirety.

FIELD OF THE INVENTION

The present invention relates to semiconductor devices and fabrication methods thereof. More particularly, it relates to floating trap type non-volatile memory devices and to fabrication methods thereof.

BACKGROUND OF THE INVENTION

A non-volatile memory device retains information stored in its memory cells even when no power is supplied. Nowadays, the non-volatile memory device is widely used in various kinds of electronic products such as cellular phones, memory cards, and so on. Generally, the non-volatile memory device has been classified as either a floating gate type device or a floating trap type device.

The floating gate type device comprises a tunneling layer, a floating gate electrode, an inter-poly dielectric layer and a control gate electrode, which are sequentially stacked on a semiconductor substrate. The floating gate type device stores charge in the floating gate electrode as free carriers. Accordingly, the entire memory charge stored in the floating gate electrode may be unfavorably discharged through even a single defect in the tunneling layer, which is usually formed of silicon oxide. The concern over the loss of the entire memory charge limits vertical scaling of the tunneling layer of the floating gate type device. In other words, in the floating gate type device, a relatively thick tunneling layer is preferably required. However, the thick tunneling layer may induce several disadvantages, for example, fluctuation of threshold voltage, high operating voltage or high power consumption.

On the other hand, the floating trap type device comprises a tunneling layer, a charge storage layer, a blocking layer and a gate electrode, which are sequentially stacked on a semiconductor substrate. The floating trap type device stores charge in a spatially isolated deep level trap of the charge storage layer. Accordingly, there is substantially no concern over the loss of the memory charge, and a relatively thin tunneling layer is applicable with an operating voltage as low as 5~10 V.

In view of fabrication processes, the floating trap type device can be fabricated more easily than the floating gate type device. This is because the floating trap type device requires no floating gate electrode so that the structure thereof is relatively simple.

One typical example of the floating trap type device is a SONOS (Silicon-Oxide-Nitride-Oxide-Silicon) non-volatile memory device. FIG. 1 is cross-sectional view illustrating a unit cell of the conventional SONOS device. An isolation region 12 is formed on a portion of a silicon substrate 10, thereby defining an active region on the other portion of the silicon substrate 10. Impurity doped regions 28 are formed in the active region. A tunneling layer 20, a charge storage layer 22 and a blocking layer 24 are stacked sequentially on the active region. On the blocking layer 24, a gate electrode 27 is formed. The tunneling layer 20 is formed of thermally grown oxide. The charge storage layer 22 is formed of silicon nitride. Though not shown in the drawing, the isolation region 12 is formed by a self-aligned trench isolation technique. The gate electrode 27 comprises a lower gate electrode 25 and an upper gate electrode 26.

FIG. 2 is a band diagram taken along a line I–I' of FIG. 1. Silicon nitride, the material of the charge storage layer 22, has an energy band gap of approximately 5 eV. Reference symbol $\emptyset_1$ and $\emptyset_2$ indicate potential barriers between the charge storage layer 22 and the tunneling layer 20 in a conduction band and a valance band, respectively. Potential barrier $\emptyset_1$ is approximately 1 eV and Potential barrier $\emptyset_2$ is approximately 2 eV.

The charge storage layer 22, silicon nitride, is known to have three kinds of trap levels within the energy band gap. The trap center of silicon nitride is a silicon atom having a dangling bond and three other bonds. Each of the three other bonds is attached to a nitrogen atom. A first trap level $E_1$ represents a state where a hole is attached to the dangling bond. A second trap level $E_2$ represents a state where a single electron is attached to the dangling bond. The second trap level $E_2$ is higher than the first trap level $E_1$. A third trap level $E_3$ represents a state where two electrons are attached to the dangling bond. The third trap level $E_3$ is higher than the second trap level $E_2$.

When a positive voltage is applied to the gate electrode 27, electrons are captured into the traps of the charge storage layer 22 by tunneling through the tunneling layer 20. The trapped electrons result in an increased threshold voltage and the cell attains a programmed state. When a negative voltage is applied to the gate electrode 27, the captured electrons are removed from the charge storage layer 22 by another tunneling into the substrate 10 through the tunneling layer 20, and the cell attains an erased state.

However, the SONOS devices have a problem, which results from their non-ideal charge retention characteristic. The SONOS devices cannot retain the charges stored in the charge storage layer 22 for a reasonable period of time. That is to say, the SONOS devices lose the information stored in the cell too readily under a date retention mode. FIG. 3 is a band diagram illustrating a charge loss mechanism of the SONOS devices. As depicted in the drawing, the energy band diagram of the SONOS device has an inclined portion. This is because the charges trapped in the charge storage layer 22 induce an internal electric field under the date retention mode. The charge loss mechanism of the SONOS device will be described as following.

Reference number 1 in FIG. 3 indicates a first charge loss path. In the first charge loss path, the trapped electrons at the third trap level $E_3$ are thermally excited to the conduction band of the charge storage layer 22. The excited electrons subsequently tunnel into the substrate 10 through the tunneling layer 20 under the influence of the internal electric field. Reference number 2 in FIG. 3 indicates a second charge loss path. In the second charge loss path, the trapped electrons are removed into the substrate 10 through the tunneling layer 20 by a band-to-band-tunneling. The electrons trapped at the higher third trap level $E_3$ can readily tunnel through the trapezoidal-shape barrier 5 of the tunneling layer 20. Reference number 3 in FIG. 3 indicates a third charge loss path. The third charge loss path is called trap-assisted-tunneling. The trap-assisted-tunneling occurs by the way of bulk traps 6 of the tunneling layer 20 and boundary regions between the tunneling layer 20 and the substrate 10. The electrons trapped even in the lower second trap level $E_2$ can readily tunnel into the substrate 10. Reference number 4 in FIG. 3 indicates a forth charge loss path. In the forth charge loss path, holes in the valence band of the substrate 10 tunnel through the tunneling layer 20 and are captured at the first trap level $E_1$ of the charge storage layer 22.

The conventional SONOS devices have received limited commercial acceptance in industry due to the poor charge retention characteristic as described above. Accordingly, the need for floating trap type non-volatile memory devices having improved charge retention characteristic remains.

SUMMARY OF THE INVENTION

It is an object of the present invention to provide a semiconductor device having a gate electrode, a blocking layer, a charge storage layer and a tunneling layer, wherein a probability of charge loss is decreased by an increased potential barrier between the charge storage layer and the tunneling layer.

It is another object of the present invention to provide a semiconductor device having a gate electrode, a blocking layer, a charge storage layer and a tunneling layer, wherein tunneling from the charge storage layer into the gate electrode is suppressed.

It is another object of the present invention to provide a semiconductor device having a gate electrode, a blocking layer, a charge storage layer and a tunneling layer, wherein charge retention characteristic is improved.

According to one aspect of the present invention, a semiconductor device is provided. The semiconductor device comprises a substrate, a gate electrode formed on the substrate and a charge storage layer interposed between the substrate and the gate electrode. The charge storage layer comprises an electrical insulating layer. The material used for the electrical insulating layer has a narrower band gap than silicon nitride. The electrical insulating layer is preferably formed of tetrahedral amorphous carbon.
The semiconductor device also comprises a blocking layer interposed between the gate electrode and the charge storage layer, a tunneling layer interposed between the substrate and the charge storage layer, and an impurity doped region in the substrate and adjacent an end of the gate electrode. The blocking layer is formed of CVD oxide. The tunneling layer is formed of thermally grown oxide. The gate electrode comprises a polysilicon layer.

According to another aspect of the present invention, a semiconductor device is provided. The semiconductor device comprises a substrate, a gate electrode formed on the substrate, and a charge storage layer interposed between the substrate and the gate electrode. The charge storage layer comprises a plurality of electrical insulating layers. The material of at least one of the plurality of electrical insulating layers has a narrower band gap than silicon nitride, and is preferably formed of tetrahedral amorphous carbon. The semiconductor device also comprises a blocking layer interposed between the gate electrode and the charge storage layer, a tunneling layer interposed between the substrate and the charge storage layer, and an impurity doped region in the substrate and adjacent an end of the gate electrode. The blocking layer is formed of CVD oxide. The tunneling layer is formed of thermally grown oxide. The gate electrode comprises a polysilicon layer. The charge storage layer may comprise a first charge storage layer formed on the substrate, a second charge storage layer formed on the first charge storage layer. The second charge storage layer has a narrower band gap than the first charge storage layer. The first charge storage layer is formed of silicon nitride or silicon oxynitride. The second charge storage layer is formed of tetrahedral amorphous carbon. The semiconductor device may further comprise a third charge storage layer. The second charge storage layer has a narrower band gap than the third charge storage layer. The third charge storage layer is formed of silicon nitride or silicon oxynitride.

BRIEF DESCRIPTION OF THE DRAWINGS

Other features of the present invention will be more readily understood from the following detail description of specific embodiment thereof when read in conjunction with the accompanying drawings, in which.

DESCRIPTION OF THE PREFERRED EMBODIMENT

Preferred embodiments of the present invention will be described hereinafter with reference to the accompanying drawings, even though the scope of the present invention is not limited to the embodiments.

Figure 4:
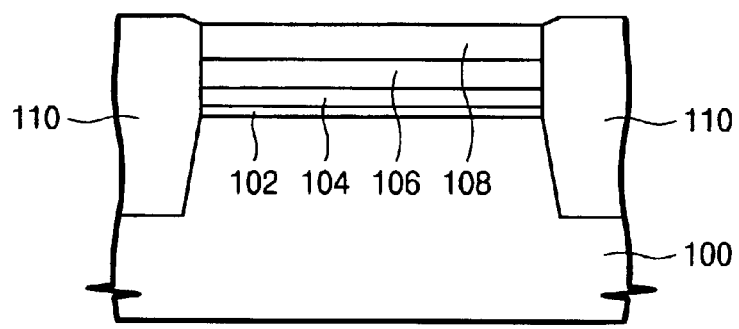
FIGS. 4 through 6 are cross-sectional views illustrating a first embodiment of a floating trap type non-volatile memory device constructed according to the present invention.
Figure 5:
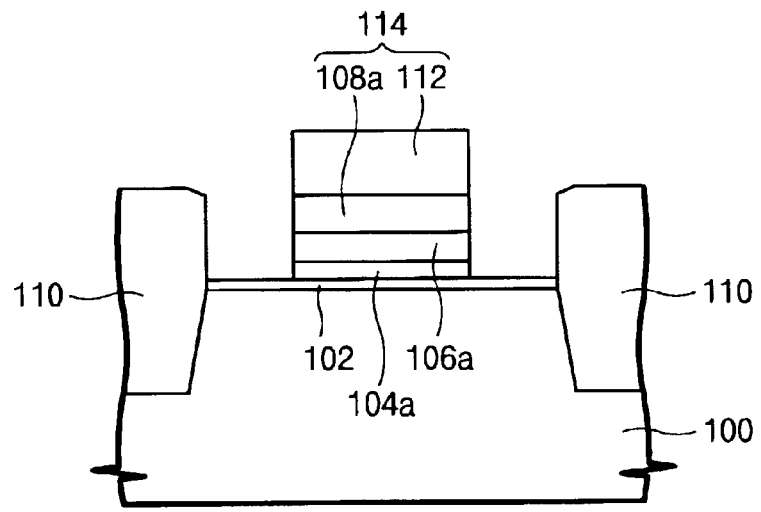
Figure 6:
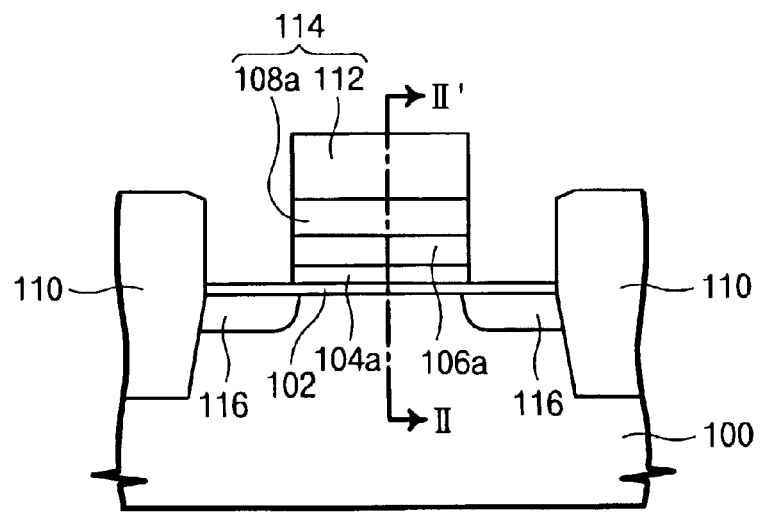

FIGS. 4 through 6 are cross-sectional views illustrating a first embodiment of a floating trap type non-volatile memory device according to the present invention. Referring to FIG. 4, an isolation region 110 is formed on a portion of a silicon substrate 100, thereby defining an active region on the other portion of the silicon substrate 100. On the active region, a tunneling layer 102, a charge storage layer 104 and a blocking layer 106 are stacked sequentially. On the blocking layer 106, a lower gate layer 108 is formed. Though not shown, the isolation region 110 is formed by a self-aligned trench isolation technique. As a result of the isolation technique, the tunneling layer 102, the charge storage layer 104, the blocking layer 106 and the lower gate layer 108 are formed on the whole surface of the active region, but not on the isolation region 110.

The tunneling layer 102 is preferably formed of thermally grown oxide. The tunneling layer 102 is preferably so thin (as much as 15~35 Å) thick that a tunneling readily occurs at even low operating voltages, i.e., a programming voltage or an erasing voltage. Moreover, the thin tunneling layer 102 is preferably required to reduce undesirable trapping of charges at the bulk of the tunneling layer 102. The charge storage layer 104 is an electrical insulating layer, the material of which has a narrower band gap than silicon nitride. The charge storage layer 104 is preferably formed of tetrahedral amorphous carbon, which is also called as amorphous diamond-like carbon. The energy band gap of the tetrahedral amorphous carbon can be controlled by an amount of hydrogen in the tetrahedral amorphous carbon. The energy band gap of the tetrahedral amorphous carbon is variable within a range of approximately 2~4 eV, which is narrower than the energy band gap of the silicon nitride. Tetrahedral amorphous carbon has many more trap levels than silicon nitride. Tetrahedral amorphous carbon has a greater trap density than silicon nitride. The resistivity of tetrahedral amorphous carbon is high enough to make it a good electrical insulator, because carriers move by a hopping conduction mechanism from trap to trap.

The blocking layer 106 is formed of CVD oxide and is preferably thick enough to prevent the charges stored at the charge storage layer 104 from being moved into a gate electrode 114, which is to be formed subsequently. For example, the blocking layer 106 is 40~120 Å thick. The lower gate layer 108 is formed of polysilicon. The purpose of forming the lower gate layer 108 is preventing any contamination on the upper surface of the blocking layer 106 during performing of the self-aligned trench isolation technique. The contamination on the upper surface of the blocking layer 106 may induce leakage current into the gate electrode 114.

In a modified embodiment of the first embodiment, the isolation region 12 may be formed by a non-self-aligned trench isolation technique, though not shown. Therefore, the tunneling layer 102, the charge storage layer 104 and the blocking layer 106 are formed both on the isolation region 12 and on the active region, and the lower gate layer 108 may not be formed. Though not shown, an upper gate layer is formed on the resultant structure. The upper gate layer is preferably formed of polysilicon or a polycide. The polycide comprises a polysilicon layer and a metal silicide layer.

Referring to FIG. 5, the upper gate layer, the lower gate layer 108, the blocking layer 106 and the charge storage layer 104 are patterned to form the gate electrode 114 on the active region. The gate electrode 114 comprises an upper gate electrode 112 and a lower gate electrode 108a. A patterned charge storage layer 104a and a patterned blocking layer 106a are interposed only between the active region and the gate electrode 114. Referring to FIG. 6, impurity doped regions 116 are formed in the active region and adjacent to the ends of the gate electrode 114 by an ion implantation method.

In another modified embodiment of the first embodiment, though not shown, only the upper gate layer and the lower gate layer 108 are patterned to form the gate electrode 114 on the active region, while the blocking layer 106 and the charge storage layer 104 are not patterned. As a result, the charge storage layer 104 and the blocking layer 106 may remain on the whole surface of the active region even after the formation of the impurity doped regions 116.

Figure 1:
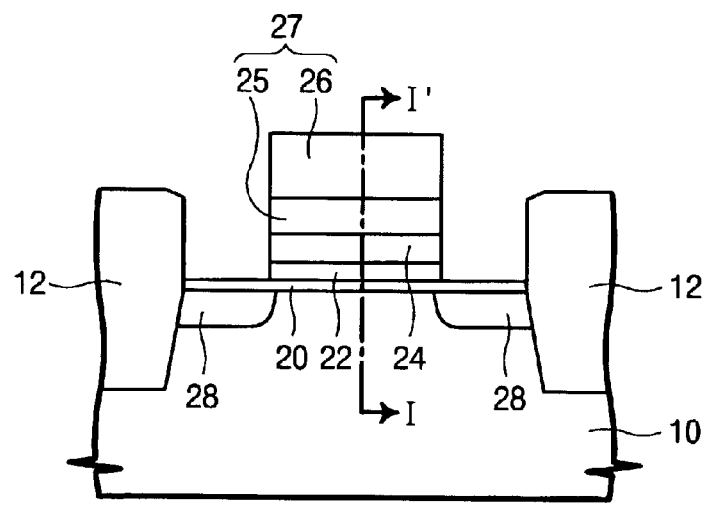
FIG. 1 is cross-sectional view illustrating the conventional floating trap type non-volatile device constructed according to the prior art.
Figure 2:
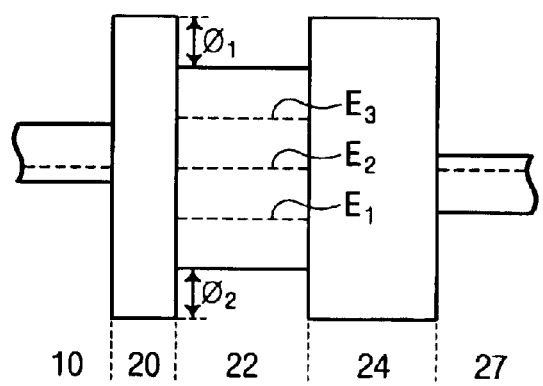
FIG. 2 is a band diagram taken along a line I–I' of FIG. 1.
Figure 3:
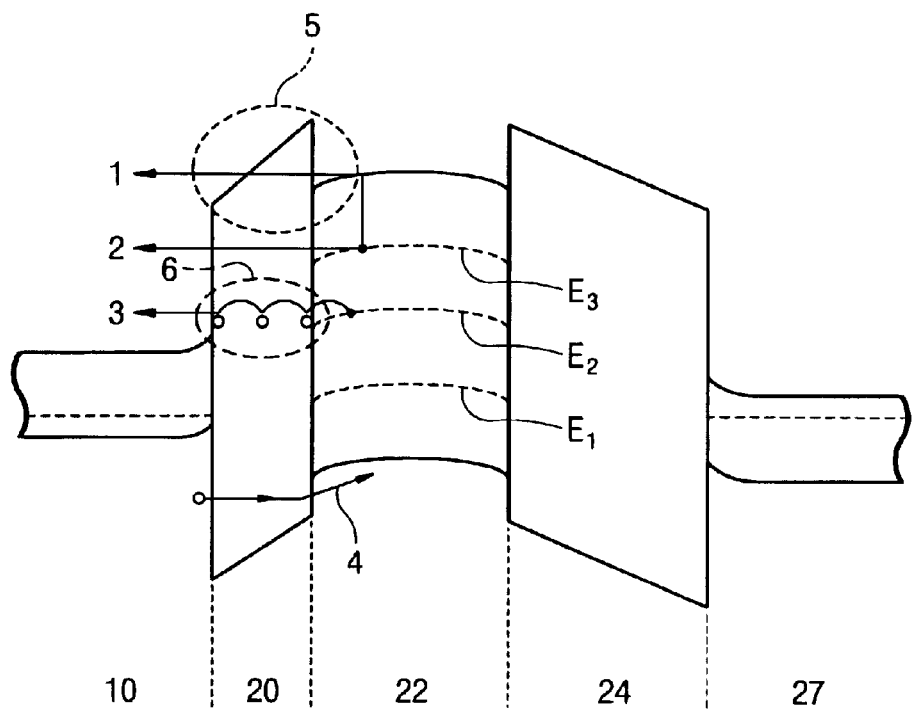
FIG. 3 is a band diagram of the conventional floating trap type device constructed according to the prior art to illustrate a charge loss mechanism.
Figure 7:
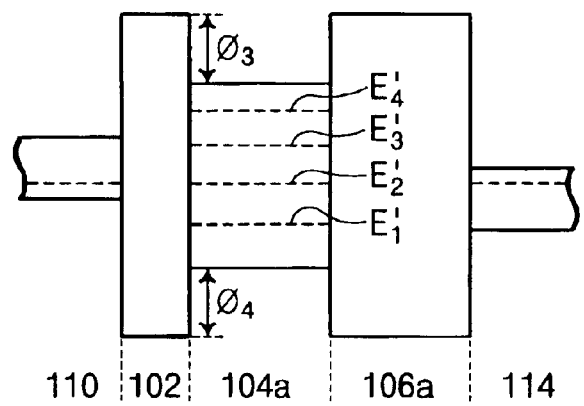
FIG. 7 is a band diagram taken along a line II–II' of FIG. 6.

FIG. 7 is a band diagram taken along a line II–II' of FIG. 6. Referring to FIG. 7, the patterned charge storage layer 104a formed of tetrahedral amorphous carbon has four kinds of trap levels within the energy band gap, i.e., E'$_1$, E'$_2$, E'$_3$ and E'$_4$. Reference symbol Ø$_3$ and Ø$_4$ indicate potential barriers between the patterned charge storage layer 104a and the tunneling layer 120 in a conduction band and a valance band, respectively. The potential barriers Ø$_3$ and Ø$_4$ are approximately 2~3 eV. The potential barriers Ø$_3$ and Ø$_4$ in this embodiment of the present invention are greater than the potential barriers Ø$_1$ and Ø$_2$ of the conventional devices of FIG. 1. Therefore, a thermally excited carrier cannot easily jump over the potential barrier Ø$_3$.

Meanwhile, in floating trap type non-volatile memory devices, a probability of tunneling Pt, can be represented by the following equation:

$$Pt = \exp\left\{-\frac{4\sqrt{2m^*_{ox}}}{3q\hbar|E_{OT}|}\left[(q\phi)^{\frac{3}{2}} - (q\phi - q|E_{OT}|x_{OT})^{\frac{3}{2}}\right]\right\}$$

wherein, $m^*_{ox}$ is an effective mass of electron in a tunneling layer, q is an electron charge, $\hbar$ is a reduced Planck constant, $E_{OT}$ is an electric field induced in the tunneling layer, $x_{OT}$ is a thickness of the tunneling layer and φ is a potential barrier between a charge storage layer and the tunneling layer. As shown in the equation, increasing potential barrier decreases the probability of tunneling Pt. That is to say, a carrier cannot easily tunnel the tunneling layer 102 in the first embodiment of the present invention, compared with the conventional device. Therefore, the data retention characteristic can be significantly improved.

Figure 8:
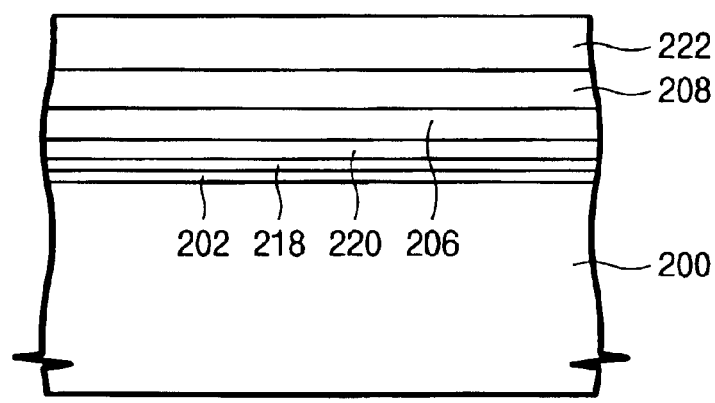
FIGS. 8 through 10 are cross-sectional views illustrating a second embodiment of the floating trap type non-volatile memory device constructed according to the present invention.
Figure 9:
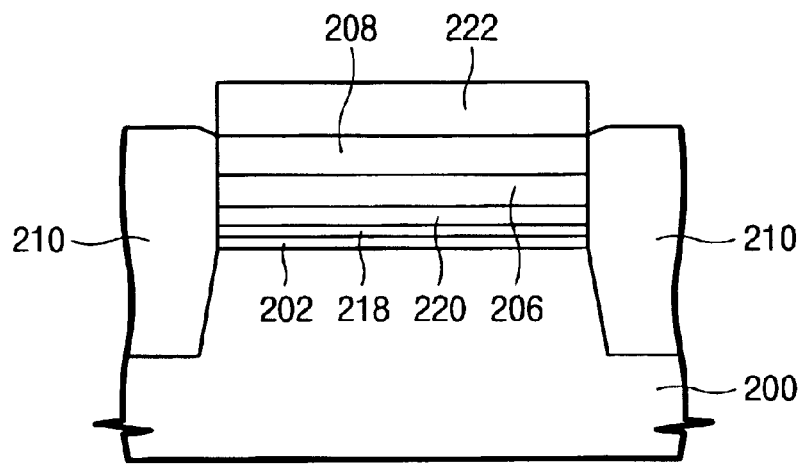
Figure 10:
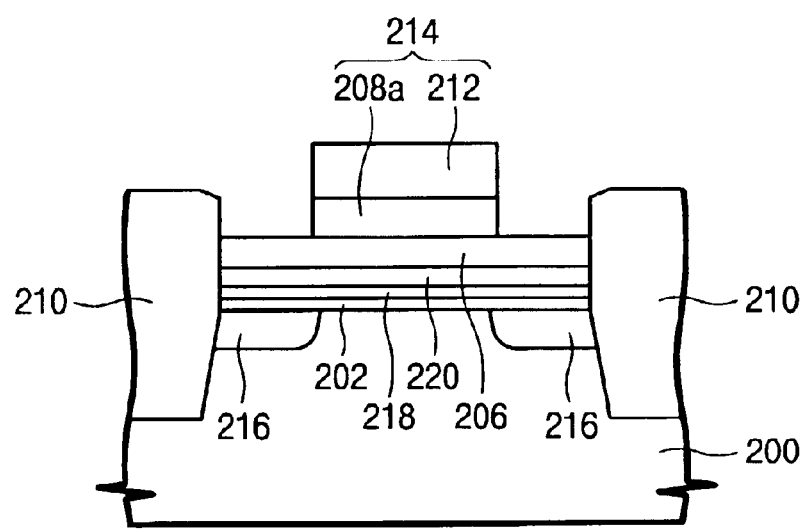

FIGS. 8 through 10 are cross-sectional views illustrating a second embodiment of the floating trap type non-volatile memory device according to the present invention. The self-aligned trench isolation technique is illustrated in FIGS. 8 and 9. Referring to FIG. 8, a tunneling layer 202, a first charge storage layer 218, a second charge storage layer 220 and a blocking layer 206 are formed sequentially on a silicon substrate 200. On the blocking layer 206, a lower gate layer 208 and a hard mask layer 222 are formed. The tunneling layer 202 is preferably formed of thermally grown oxide, which is 15~35 Å thick. The first charge storage layer 218 is formed of a material having a narrower band gap than that of the tunneling layer 202. The first charge storage layer 218 is preferably formed of silicon nitride or silicon oxynitride. The second charge storage layer 220 is formed of a material having a narrower band gap than that of the first charge storage layer 218. The first charge storage layer 218 is preferably formed of tetrahedral amorphous carbon. The total thickness of the first charge storage layer 218 and the second charge storage layer 220 preferably approximates to the thickness of the charge storage layer 22 in the conventional SONOS devices.

Referring to FIG. 9, the hard mask layer 222, the lower gate layer 208, the blocking layer 206, the second charge storage layer 220, the first charge storage layer 218 and the tunneling layer 202 are partially removed on a portion of the substrate 200. The portion of the substrate 200 is removed to form a trench in the substrate 200. A trench filling material is formed on the resultant structure to fill the trench. The trench filling is partially removed by a chemical mechanical polishing (CMP) to expose the hard mask layer 222, thereby forming an isolation regions 210 that fills the trench and defining an active region. As a result, the tunneling layer 202, the first charge storage layer 218, the second charge storage layer 220, the blocking layer 206, the lower gate layer 208 and the hard mask layer 222 are formed on the whole surface of the active region, but not on the isolation region 210. Subsequently, a top portion of the isolation region 210 is recessed, i.e., partially removed so that the top surface of the recessed isolation region 210 is at an altitude of the top surface of the lower gate layer 208.

Referring to FIG. 10, the hard mask layer 222 is removed. Subsequently, though not shown, an upper gate layer is formed on the resultant structure. The upper gate layer and the lower gate layer 208 are patterned to form the gate electrode 214 on the active region. The gate electrode 214 comprises an upper gate electrode 212 and a lower gate electrode 208a. Impurity doped regions 216 are formed in the active region and adjacent to the ends of the gate electrode 214 by an ion implantation method.

Figure 11:
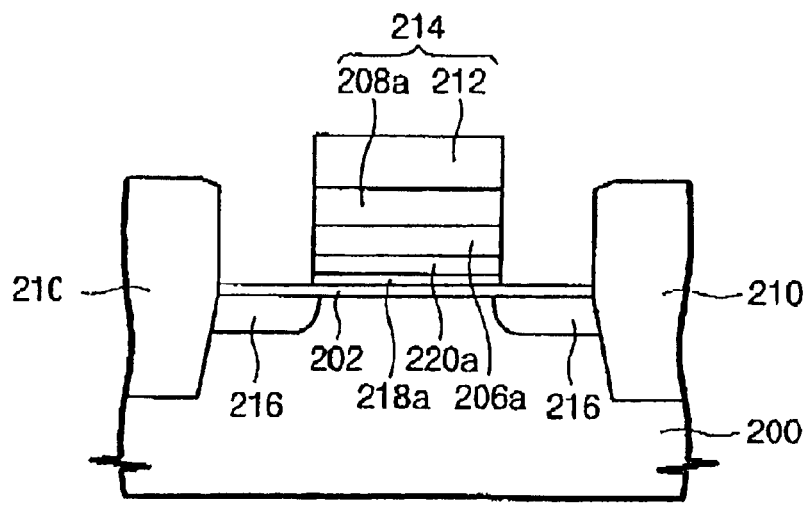
FIG. 11 is cross-sectional view illustrating a modified embodiment of the second embodiment.

FIG. 11 is cross-sectional view illustrating a modified version of the second embodiment. In this modified embodiment, the blocking layer 206, the first charge storage layer 218 and the second charge storage layer 220 are also patterned. A patterned first charge storage layer 218a, a patterned second charge storage layer 220a and a patterned blocking layer 206a are interposed only between the active region and the gate electrode 214. Subsequently, impurity doped regions 216 are formed in the active region and adjacent to the ends of the gate electrode 214 by an ion implantation method.

Figure 12:
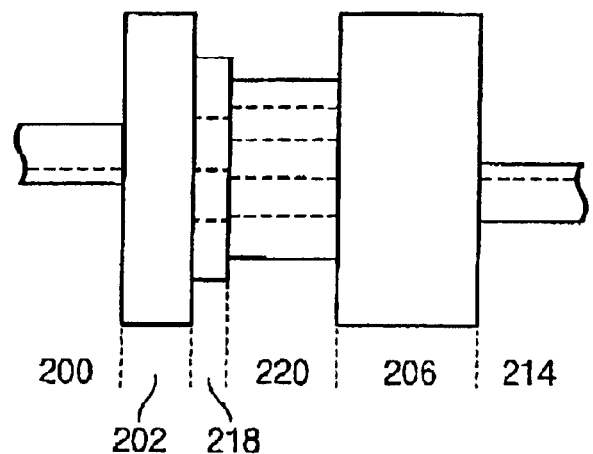
FIG. 12 is a band diagram of FIG. 10.

FIG. 12 is a band diagram of FIG. 10. Referring to FIG. 12, the first charge storage layer 218 is formed of a material having a narrower band gap than that of the tunneling layer 202. The second charge storage layer 220 is formed of a material having a narrower band gap than that of the first charge storage layer 218. Therefore, the band diagram has a stairs-like shape potential barrier. When a voltage is applied into the gate electrode 214, carriers are trapped within the first charge storage layer 218 and the second charge storage layer 220 by tunneling through the tunneling layer 202. The stairs-like shape potential barrier decreases the probability of tunneling into the substrate 200 under a data retention mode. Therefore, the data retention characteristic is significantly improved.

Figure 13:
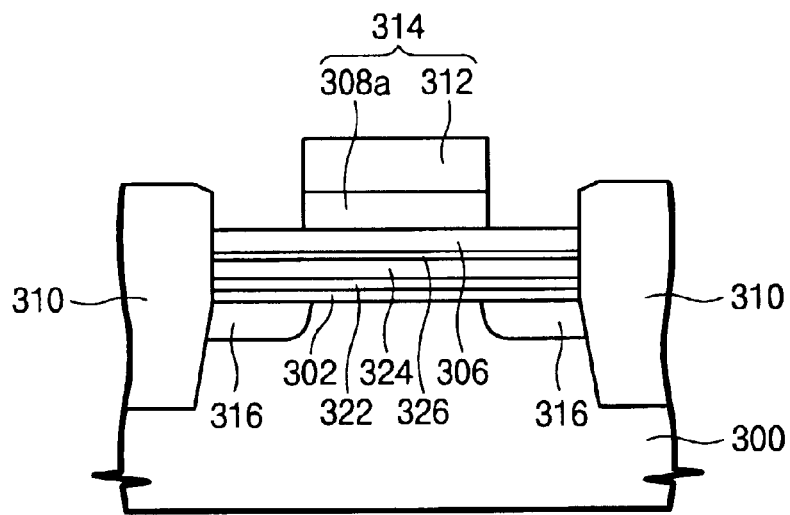
FIG. 13 is cross-sectional view illustrating a third embodiment of the floating trap type non-volatile memory device according to the present invention.

FIG. 13 is cross-sectional view illustrating a third embodiment of the floating trap type non-volatile memory device according to the present invention. The third embodiment is substantially same as the second embodiment except for the charge storage layers. Referring to FIG. 13, an isolation region 310 is formed on a portion of a silicon substrate 300, thereby defining an active region on the other portion of the substrate 300. A tunneling layer 302, a first charge storage layer 322, a second charge storage layer 324, a third charge storage layer 326 and a blocking layer 306 are formed sequentially on the active region. The first charge storage layer 322 and the third charge storage layer 326 are formed of a material having a narrower band gap than those of the tunneling layer 302 and the blocking layer 306. The first charge storage layers 322 and the third charge storage layers 326 are preferably formed of silicon nitride or silicon oxynitride. The second charge storage layer 324 is formed of a material having a narrower band gap than those of the first charge storage layer 322 and the third charge storage layer 326. The second charge storage layer 324 is preferably formed of tetrahedral amorphous carbon. A gate electrode 314 is formed on the blocking layer 306. The gate electrode 314 comprises an upper gate electrode 312 and a lower gate electrode 308a. Impurity doped regions 316 are formed in the active region and adjacent to the ends of the gate electrode 314 by an ion implantation method.

Figure 14:
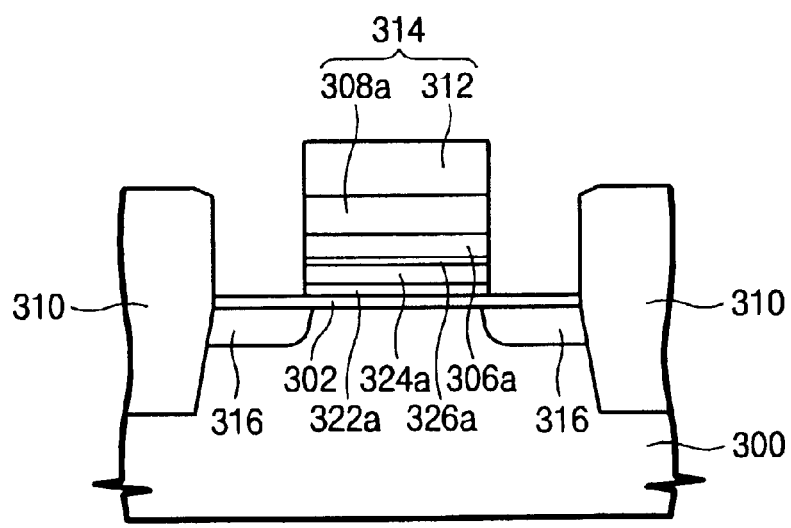
FIG. 14 is cross-sectional view illustrating a modified embodiment of the third embodiment.

FIG. 14 is cross-sectional view illustrating a modified version of the third embodiment. In this modified embodiment, the blocking layer 306, the first charge storage layer 322, the second charge storage layer 324 and the third charge storage layer 326 are also patterned to form respective patterned blocking layer 306a, first charge storage layer 322a, second charge storage layer 324a and third charge storage layer 326a. The patterned blocking layer 306a, patterned first charge storage layer 322a, patterned second charge storage layer 324a and patterned third charge storage layer 326a are interposed only between the active region and the gate electrode 314. Subsequently, impurity doped regions 316 are formed in the active region and adjacent to the ends of the gate electrode 314 by an ion implantation method.

Figure 15:
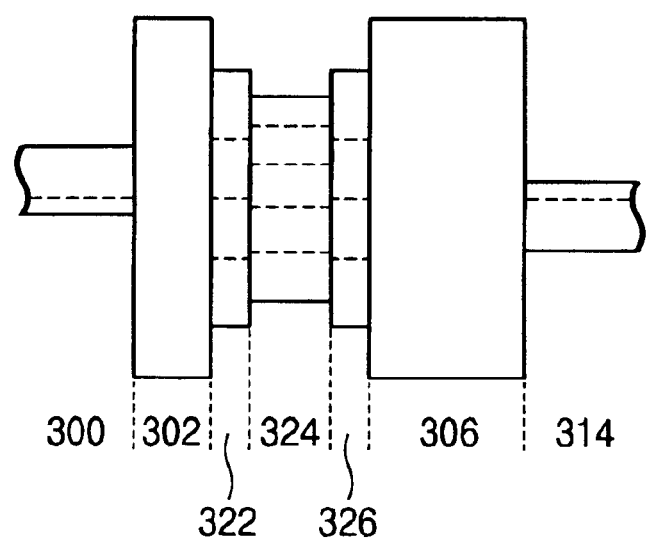
FIG. 15 is a band diagram of FIG. 13.

FIG. 15 is a band diagram of the structure shown in FIG. 13. Referring to FIG. 15, the first charge storage layer 322 and the third charge storage layer 326 are formed of a material having a narrower band gap than those of the tunneling layer 302 and the blocking layer 306. The second charge storage layer 324 is formed of a material having a narrower band gap than those of the first charge storage layer 322 and the third charge storage layer 326. When a voltage is applied into the gate electrode 314, carriers are trapped into the first charge storage layer 322, the second charge storage layer 324 and the third charge storage layer 326 by tunneling through the tunneling layer 302. The trapped carriers at the first charge storage layer 322 and the third charge storage layer 326 can be moved into the second charge storage layer 324 by the internal electric field under a data retention mode. For a similar reason to that described in the second embodiment, the probability of carrier tunneling into the substrate 200 is substantially decreased under a data retention mode. Moreover, the probability of carrier tunneling into the gate electrode 314 is also substantially decreased due to the unique shape of the potential barrier. Therefore, the data retention characteristic is significantly improved.

In the drawings and specification, there have been disclosed typical preferred embodiments of the invention and, although specific terms are employed, they are used in a generic and descriptive sense only and not for purpose of limitation, the scope of the invention being set forth in the following claims.

What is claimed is:

1. A semiconductor device comprising:
   a substrate;
   a gate electrode formed on the substrate; and
   a charge storage layer interposed between the substrate and the gate electrode, wherein the charge storage layer comprises an electrical insulating layer, and wherein the material of the electrical insulating layer is formed of tetrahedral amorphous carbon.

2. The semiconductor device of claim 1, which further comprises:
   a blocking layer interposed between the gate electrode and the charge storage layer;
   a tunneling layer interposed between the substrate and the charge storage layer; and
   an impurity doped region in the substrate and adjacent an end of the gate electrode.

3. The semiconductor device of claim 2, wherein the blocking layer is formed of CVD oxide.

4. The semiconductor device of claim 2, wherein the blocking layer has a thickness between 40 and 120 Å.

5. The semiconductor device of claim 2, wherein the tunneling layer is formed of thermally grown oxide.

6. The semiconductor device of claim 2, wherein the tunneling layer has a thickness between 15 and 35 Å.

7. The semiconductor device of claim 1, wherein the gate electrode comprises a polysilicon layer.

8. A semiconductor device comprising:
   a substrate;
   a gate electrode formed on the substrate;
   a charge storage layer interposed between the substrate and the gate electrode, wherein the charge storage layer comprises a plurality of electrical insulating layers; and
   a blocking layer interposed between the gate electrode and the charge storage layer;
   a tunneling layer interposed between the substrate and the charge storage layer; and an impurity doped region in the substrate and adjacent an end of the sate electrode, wherein the charge storage layer has a band gap with a stairs-line shape that is less than a band gap of the tunneling layer and the blocking layer.

9. The semiconductor device of claim 8, wherein the material of at least one of the plurality of electrical insulating layers has a narrower band gap than silicon nitride.

10. The semiconductor device of claim 9, wherein the charge storage layer comprises:
a first charge storage layer formed on the substrate;
a second charge storage layer formed on the first charge storage layer; and
a third charge storage layer formed on the second charge storage layer, wherein each of the first and third charge storage layers has a narrower band gap than the blocking layer.

11. The semiconductor device of claim 9, wherein the charge storage layer comprises:
a first charge storage layer formed on the substrate;
a second charge storage layer formed on the first charge storage layer; and
a third charge storage layer formed on the second charge storage layer, wherein each of the first and third charge storage layers has a narrower band gap than the tunneling layer.

12. The semiconductor device of claim 9, wherein the blocking layer is formed of CVD oxide.

13. The semiconductor device of claim 9, wherein the blocking layer has a thickness between 40 and 120 Å.

14. The semiconductor device of claim 9, wherein the tunneling layer is formed of thermally grown oxide.

15. The semiconductor device of claim 9, wherein the tunneling layer has a thickness between 15 and 35 Å.

16. The semiconductor device of claim 9, wherein the gate electrode comprises a polysilicon layer.

17. The semiconductor device of claim 9, wherein the at least one of the plurality of electrical insulating layers is formed of tetrahedral amorphous carbon.

18. The semiconductor device of claim 8, wherein the charge storage layer comprises:
a first charge storage layer formed on the substrate; and
a second charge storage layer formed on the first charge storage layer, wherein the second charge storage layer has a narrower band gap than the first charge storage layer.

19. The semiconductor device of claim 18, wherein the first charge storage layer is formed of silicon nitride or silicon oxynitride.

20. The semiconductor device of claim 18, wherein the second charge storage layer is formed of tetrahedral amorphous carbon.

21. The semiconductor device of claim 18, which further comprises a third charge storage layer, wherein the second charge storage layer has a narrower band gap than the third charge storage layer.

22. The semiconductor device of claim 21, wherein the first charge storage layer is formed of silicon nitride or silicon oxynitride.

23. The semiconductor device of claim 21, wherein the second charge storage layer is formed of tetrahedral amorphous carbon.

24. The semiconductor device of claim 21, wherein the third charge storage layer is formed of silicon nitride or silicon oxynitride.

25. The semiconductor device of claim 8, wherein the charge storage layer comprises:
a second charge storage layer formed on the substrate; and
a third charge storage layer formed on the second charge storage layer, wherein the second charge storage layer has a narrower band gap than the third charge storage layer.

26. A semiconductor device comprising:
a substrate;
a gate electrode formed on the substrate; and
a charge storage layer interposed between the substrate and the gate electrode, wherein the charge storage layer comprises a plurality of electrical insulating layers, wherein the at least one of the plurality of electrical insulating layers is formed of tetrahedral amorphous carbon.

27. A semiconductor device comprising:
a substrate;
a gate electrode formed on the substrate; and
a charge storage layer interposed between the substrate and the gate electrode, wherein the charge storage layer comprises a plurality of electrical insulating layers and further comprises:
a first charge storage layer formed on the substrate; and
a second charge storage layer formed on the first charge storage layer, wherein the second charge storage layer is formed of tetrahedral amorphous carbon and has a narrower band gap than the first charge storage layer.

28. A semiconductor device comprising:
a substrate;
a gate electrode formed on the substrate; and
a charge storage layer interposed between the substrate and the gate electrode, wherein the charge storage layer comprises a plurality of electrical insulating layers, wherein the charge storage layer comprises:
a first charge storage layer formed on the substrate;
a second charge storage layer formed on the first charge storage layer; and
a third charge storage layer, wherein the second charge storage layer is formed of tetrahedral amorphous carbon and has a narrower band gap than the first charge storage layer and the third charge storage layer.

* * * * *

UNITED STATES PATENT AND TRADEMARK OFFICE
CERTIFICATE OF CORRECTION

PATENT NO.     : 6,753,572 B2
DATED          : June 22, 2004
INVENTOR(S)    : Lee et al.

It is certified that error appears in the above-identified patent and that said Letters Patent is hereby corrected as shown below:

Column 9,
Line 2, "of the sate electrode," should read -- of the gate electrode, --.

Signed and Sealed this

First Day of February, 2005

JON W. DUDAS
*Director of the United States Patent and Trademark Office*